US009210795B2

(12) United States Patent
Karikalan

(10) Patent No.: US 9,210,795 B2
(45) Date of Patent: Dec. 8, 2015

(54) CONFORMAL REFERENCE PLANES IN SUBSTRATES

(71) Applicant: Broadcom Corporation, Irvine, CA (US)

(72) Inventor: Sampath Komarapalayam Velayudham Karikalan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/689,271

(22) Filed: Nov. 29, 2012

(65) Prior Publication Data
US 2013/0112464 A1 May 9, 2013

Related U.S. Application Data

(63) Continuation of application No. 12/259,775, filed on Oct. 28, 2008, now Pat. No. 8,344,819.

(51) Int. Cl.
*H01P 3/08* (2006.01)
*H05K 1/02* (2006.01)
*H05K 1/09* (2006.01)

(52) U.S. Cl.
CPC *H05K 1/02* (2013.01); *H01P 3/082* (2013.01); *H05K 1/0219* (2013.01); *H05K 1/09* (2013.01); *H01L 2924/0002* (2013.01);
(Continued)

(58) Field of Classification Search
CPC ......... H01P 3/081; H01P 3/082; H01P 3/088; H01P 3/003; H01P 3/006
USPC ................................ 333/1, 4, 5, 33, 238, 246
See application file for complete search history.

(56) References Cited

U.S. PATENT DOCUMENTS 4,776,087 A 10/1988 Cronin et al.
5,164,692 A 11/1992 Gertel et al.
5,334,800 A 8/1994 Kenney
(Continued)

FOREIGN PATENT DOCUMENTS

EP 0312682 A2 4/1989
EP 1187514 A2 3/2002
JP 2006173310 A 6/2006

OTHER PUBLICATIONS

European Search Report Received for European Patent Application No. 09013488.3, mailed on Mar. 10, 2010, 3 pages.
(Continued)

*Primary Examiner* — Benny Lee
(74) *Attorney, Agent, or Firm* — Fiala & Weaver P.L.L.C.

(57) ABSTRACT

Methods, systems, and apparatuses for circuit boards are provided herein. An electrically insulating material is formed over one or more traces on a circuit board. One or more further electrically conductive features are present on the circuit board. A layer of an electrically conductive material is formed over the one or more traces that is electrically isolated from the one or more traces by the electrically insulating material, and is in electrical contact with the one or more further electrically conductive features. The electrically conductive material confines magnetic and electric fields produced when the one or more traces conduct an alternating current. By confining the magnetic and electric field distributions in this manner, problems of interference and/or crosstalk with adjacent signal traces are reduced or eliminated.

20 Claims, 14 Drawing Sheets

(52) U.S. Cl.
CPC .......... *H05K 2201/0715* (2013.01); *H05K 2201/09236* (2013.01); *Y10T 29/49155* (2015.01)

(56) References Cited

U.S. PATENT DOCUMENTS

| | | | |
|---|---|---|---|
| 5,357,138 | A | 10/1994 | Kobayashi |
| 5,818,315 | A | 10/1998 | Moongilan |
| 5,828,555 | A | 10/1998 | Itoh |
| 6,075,423 | A | 6/2000 | Saunders |
| 6,133,621 | A | 10/2000 | Gaibotti et al. |
| 6,515,236 | B2 | 2/2003 | Matsuda |
| 8,344,819 | B2 | 1/2013 | Karikalan |
| 2001/0040274 | A1 | 11/2001 | Hidaka |
| 2002/0053469 | A1 | 5/2002 | Matsuda |
| 2002/0130739 | A1 | 9/2002 | Cotton |
| 2005/0156692 | A1 | 7/2005 | Dove et al. |
| 2005/0156693 | A1 | 7/2005 | Dove et al. |
| 2009/0242259 | A1 | 10/2009 | Ho et al. |
| 2010/0102903 | A1 | 4/2010 | Karikalan |

OTHER PUBLICATIONS

Office Action dated Mar. 31, 2014, received in Taiwan Patent Application No. 98136434 dated Nov. 23, 2012, 7 pages of Taiwan Office action.

600

602 — form a first electrically conductive feature, a second electrically conductive feature, and an electrically conductive trace on a first surface of a dielectric material layer, the electrically conductive trace being positioned between the first and second electrically conductive features 604 — form a layer of an electrically insulating material on the first surface of the dielectric material that covers at least a portion of the electrically conductive trace 606 — form a layer of an electrically conductive material on the electrically insulating material and in electrical contact with the first and second electrically conductive features

FIG. 6

CONFORMAL REFERENCE PLANES IN SUBSTRATES

This application claims priority to non-provisional U.S. patent application Ser. No. 12/259,775, filed Oct. 28, 2008, now U.S. Pat. No. 8,344,819, issued Jan. 1, 2013, the entirety of which is incorporated by reference herein.

BACKGROUND OF THE INVENTION

1. Field of the Invention

The present invention relates to circuit board technology.

2. Background Art

A transmission line is a pair of electrical conductors on a circuit board used to carry an electrical signal and corresponding reference signal. The distribution of a magnetic field within and around a transmission line determines the amount of self-inductance of the transmission line and the mutual-inductance of the transmission line to adjacent signal lines. These inductance values are major factors in defining transmission line characteristics such as crosstalk and characteristic impedance. The amplitude and timing integrity of the signals carried by a transmission line are highly dependent on these two characteristics. The magnetic field distribution of a transmission line is a significant factor in preserving signal integrity, and thus is an important factor in the intended function of a transmission line.

In one configuration, a transmission line may include a signal trace and a reference plane. The signal trace carries the forward electrical signal of the transmission line pair, and the reference plane carries the return current related to the electrical signal. The reference plane may be a ground plane or other voltage plane of a circuit board. The signal trace is typically routed over the reference plane. A layer of a dielectric material separates the signal trace and the reference plane. A net magnetic field around such a transmission line is a vectorial sum of a first magnetic field due to the forward current on the signal trace and a second magnetic field due to the return current on the reference plane. When the return current path on the reference plane is very close in distance and size to the forward current path, the first and second magnetic field components cancel out each other at most locations around the transmission line, due to their opposing phases. In such a case, the net magnetic field tends to be mainly concentrated between the signal trace and the reference plane.

A reference layer may be connected to a ground or voltage reference potential, and may be located above or below one or more signal traces of the circuit board. Such a reference layer configuration aids in controlling a characteristic impedance of transmission lines, a crosstalk between adjacent signal traces, and an electromagnetic interference (EMI) radiation emanating from transmission lines, by confining the electric and magnetic fields in a smaller region around the transmission lines. However, implementing one or more reference planes in a circuit board leads to an increase in the number of metal layers in the circuit board. The increase in the number of metal layers increases a cost and a thickness of the circuit board. Such cost and thickness increases are not desired, especially for consumer electronics devices and systems that need to be as thin as possible and have dwindling average selling prices.

SUMMARY OF THE INVENTION

Methods, systems, and apparatuses for circuit boards are provided herein. In an example implementation, a circuit board includes an electrically insulating material formed over one or more traces on the circuit board. One or more further electrically conductive features are present on the circuit board. A layer of an electrically conductive material is formed over the one or more traces that is electrically isolated from the one or more traces by the electrically insulating material, and is in electrical contact with the further electrically conductive features. The electrically conductive material confines magnetic and electric fields produced when the one or more traces conduct an alternating current. By confining the magnetic and electric field distributions in this manner, problems of interference and/or crosstalk with adjacent signal traces are reduced or eliminated.

In another example configuration, a circuit board includes a dielectric material layer, first and second electrically conductive features, an electrically conductive trace, an electrically insulating material, and an electrically conductive material. The dielectric material layer has opposing first and second surfaces. The first and second electrically conductive features are on the first surface of the dielectric material layer. The electrically conductive trace is on the first surface of the dielectric material layer between the first and second electrically conductive features. The electrically insulating material is on the first surface of the dielectric material layer, covering at least a portion of the electrically conductive trace. The electrically conductive material is formed on the electrically insulating material in electrical contact with the first and second electrically conductive features.

The electrically conductive material may be substantially continuous, may be formed in a grid shape, or may have other form. The first and second electrically conductive features may be electrically conductive traces, conductive pads, or other electrically conductive features. One or more additional electrically conductive features may be present on the first surface of the dielectric material layer in electrical contact with the electrically conductive material.

One or more additional traces may be positioned between the first and second electrically conductive features on the first surface of the dielectric material layer that are covered by the electrically insulating material (and by the electrically conductive material).

The first and second electrically conductive features may be electrically coupled to an electrical potential, such as a power signal or ground signal.

Methods for forming circuit boards are also provided. In one example method, a first electrically conductive feature, a second electrically conductive feature, and an electrically conductive trace are formed on a first surface of a dielectric material layer, the electrically conductive trace being positioned between the first and second electrically conductive features. A layer of an electrically insulating material is formed on the first surface of the dielectric material layer that covers at least a portion of the electrically conductive trace. A layer of an electrically conductive material is formed on the electrically insulating material in electrical contact with the first and second electrically conductive features.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 6 shows a flowchart for forming a circuit board, according to an example embodiment of the present invention.

Figure 1:
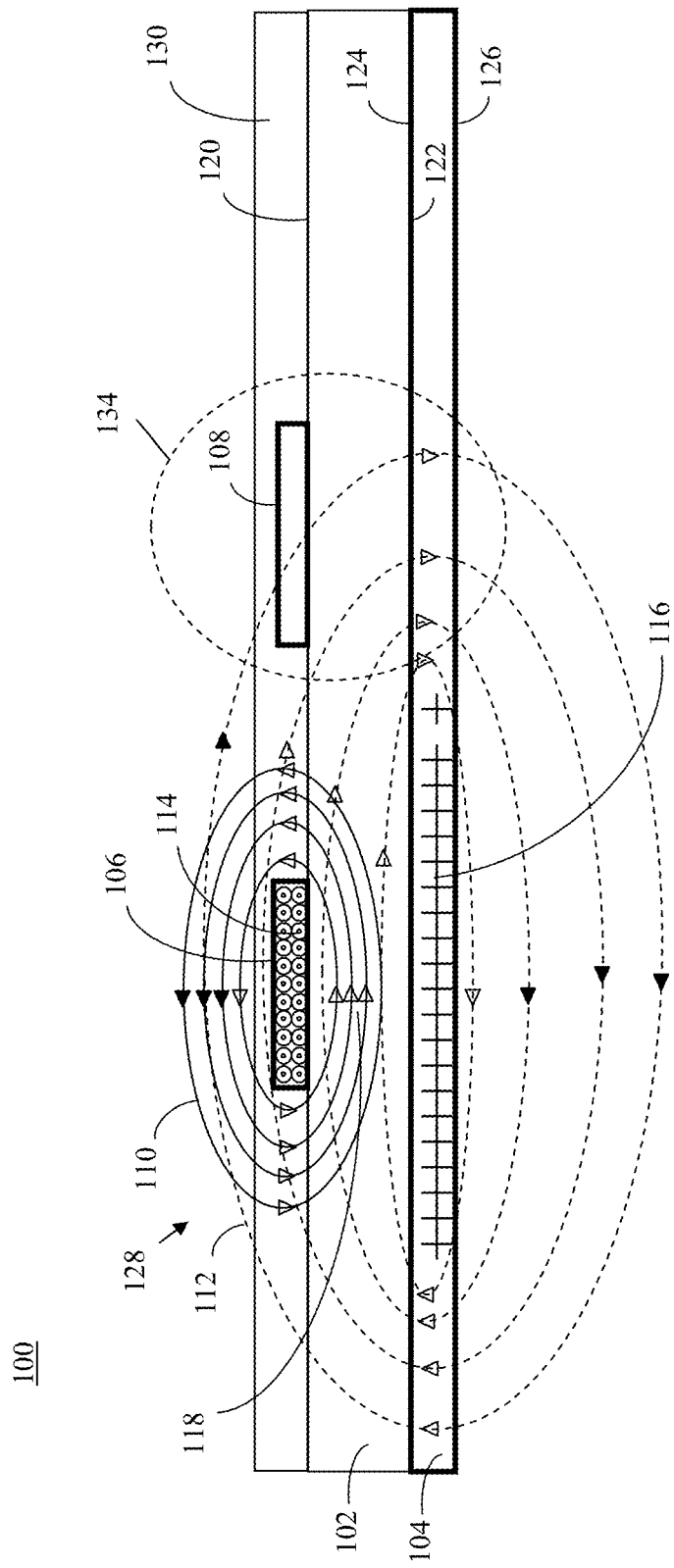
FIG. 1 shows a cross-sectional view of a circuit board that includes a transmission line, and shows magnetic fields related to the transmission line.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Magnetic Field and Electric Field Distributions in Circuit Boards

A transmission line is a pair of electrical conductors on a circuit board used to carry an electrical signal and a corresponding reference signal. The distribution of a magnetic field within and around a transmission line determines the amount of self-inductance of the transmission line and the mutual-inductance of the transmission line to adjacent signal lines. These inductance values are important factors in defining transmission line characteristics such as crosstalk and characteristic impedance. The amplitude and timing integrity of the signals carried by a transmission line are highly dependent on these characteristics. The magnetic field distribution of a transmission line is a significant factor in preserving signal integrity, and thus is an important factor in the intended function of that transmission line.

Transmission lines can be configured in various ways. In one configuration, a transmission line may include a signal trace and a reference plane. FIG. 1 shows a cross-sectional view of a circuit board 100 that includes such a transmission line. As shown in FIG. 1, circuit board 100 includes a dielectric material layer 102, a reference plane layer 104, first and second electrical conductors 106 and 108, and an insulating layer 130. First and second electrical conductors 106 and 108 form a transmission line 128.

As shown in the example of FIG. 1, reference plane layer 104 has opposing surfaces 124 and 126. Reference plane layer 104 may be formed in any manner, as would be known to persons skilled in the relevant art(s). For example, reference plane layer 104 may be formed or received as a sheet, such as a foil, that includes one or more layers of electrically conductive material(s). For instance, reference plane layer 104 may be a metal, such as copper, aluminum, gold, silver, tin, nickel, lead, or a combination of metals/alloy, or may be formed of an alternative electrically conductive material. Reference plane layer 104 may be configured to function as a ground plane or other voltage plane for circuit board 100.

As shown in FIG. 1, first surface 124 of reference plane layer 104 is attached to a second surface 122 of dielectric material layer 102. Reference plane layer 104 and dielectric material layer 102 may be attached together in any manner, including according to conventional circuit board fabrication techniques, as would be known to persons skilled in the relevant art(s). For example, reference plane layer 104 and dielectric material layer 102 may be attached using an adhesive material (e.g., an epoxy), by a lamination process, or in any other manner. Dielectric material layer 102 may include any electrically insulating or dielectric material, including an organic, plastic, ceramic, and/or tape material. Example materials for dielectric material layer 102 include materials such as polyimide, "BT", which includes a resin called bis-maleimide triazine, "FR-4," which is a fire-retardant epoxy resin-glass cloth laminate material, "FR-5," and/or other similar materials. Circuit board 100 may include further layers in additional to reference plane layer 104 and dielectric material layer 102. A multi-layered version of circuit board 100 may be formed from alternating layers of electrically conductive materials and electrically insulating materials. Circuit board 100 may be a printed circuit board (PCB), a substrate of an integrated circuit package, or any other type of circuit board.

As shown in FIG. 1, first and second electrical conductors 106 and 108 are present on a first surface 120 of dielectric material layer 102. First electrical conductor 106 may be formed during a separate fabrication process or during a same fabrication process as used to form second electrical conductor 108. First and second electrical conductors 106 and 108 may be circuit traces, for example. First and second electrically conductors 106 and 108 may be formed in any manner, as would be known to persons skilled in the relevant art(s). For example, first and second electrically conductors 106 and 108 may be formed from a sheet that includes one or more layers of electrically conductive material(s), such as a metal foil. An etching process or other process may be used to define first electrical conductor 106 and second electrical conductor 108 in the sheet. First and second electrically conductors 106 and 108 may be formed of a metal, such as copper, aluminum, gold, silver, tin, nickel, lead, or a combination of metals/alloy, or may be formed of an alternative electrically conductive material. First and second electrically conductors 106 and 108 may be attached to dielectric material layer 102 in any manner, including using an adhesive material (e.g., an epoxy), by a lamination process, or in any other suitable manner, as would be known to persons skilled in the relevant art(s).

As shown in the example of FIG. 1, insulating layer 130 is formed on first surface 120 of dielectric material layer 102. Insulating layer 130 covers first and second electrical conductors 106 and 108 on dielectric material layer 102. Insulating layer 130 may be any suitable insulating/dielectric material, such as an epoxy, a mold compound, and/or a plastic or polymer layer, such as a solder mask layer. Insulating layer 130 may be formed in any manner, as would be known to persons skilled in the relevant art(s). For example, insulating layer 130 may be formed according to a spraying process, a silkscreen process, a vacuum lamination process, or any other suitable process, as would be known to persons skilled in the relevant art(s). Insulating layer 130 may be applied to circuit board 100 to provide a protective coating for first and second electrical conductors 106 and 108 to avoid short circuits, to facilitate automatic surface mount attachment of chips/devices on circuit board 100 (e.g., using solder reflow), and/or for other purpose.

Dielectric material layer 102 separates first electrical conductor 106 and reference plane layer 104. First electrical conductor 106 and reference plane layer 104 form transmission line 128 of circuit board 100. First electrical conductor 106 carries an electrical signal (e.g., a forward current) of transmission line 128, and reference plane layer 104 carries a return current of transmission line 128. In the example of FIG. 1, a direction of the forward electrical current of the electrical signal flowing through first electrical conductor 106 is indicated by a first indicator 114 (as flowing out of the page). A direction of the return current flowing through reference plane layer 104 is indicated in FIG. 1 by a second indicator 116 (as flowing into the page). A net magnetic field around transmission line 128 is a vectorial sum of a first magnetic field 110 due to the forward current on first electrical conductor 106 and a second magnetic field 112 due to the return current on reference plane layer 104. Due to the "right hand rule," first magnetic field 110 has a counter clockwise direction around first electrical conductor 106, and second magnetic field 112 has a clockwise direction.

It is desirable for first electrical conductor 106 and reference plane layer 104 to be as close together as possible. If the return current path in reference plane layer 104 is closely adjacent to that of the forward current path through first electrical conductor 106, first and second magnetic fields 110 and 112 may substantially cancel out each other at most locations around transmission line 128, due to their opposing phases. In such a situation, a resulting net magnetic field tends to be mainly concentrated in a region 118 between first electrical conductor 106 and reference plane layer 104. However, in conventional circuit boards, some separation between first electrical conductor 106 and reference plane layer 104 is present due to a required thickness of dielectric material layer 102 (e.g., to provide structural support, etc.). This separation can result in a significant amount of the net magnetic field from transmission line 128 fringing with adjacent transmission lines, such as a second transmission line 134 formed by second electrical conductor 108 and reference plane layer 104.

The mutual capacitance between two adjacent transmission lines on a common circuit board is a major factor in determining important characteristics such as crosstalk and differential impedance (where the adjacent transmission lines belong to a differential pair) of those transmission lines. The mutual capacitance is directly proportional to the relative permittivity (effective dielectric constant) of the dielectric medium that separates the two transmission lines. The mutual capacitance is directly proportional to the area of overlap between the two transmission lines. Furthermore, the mutual capacitance is inversely proportional to the distance between the two transmission lines.

Figure 2:
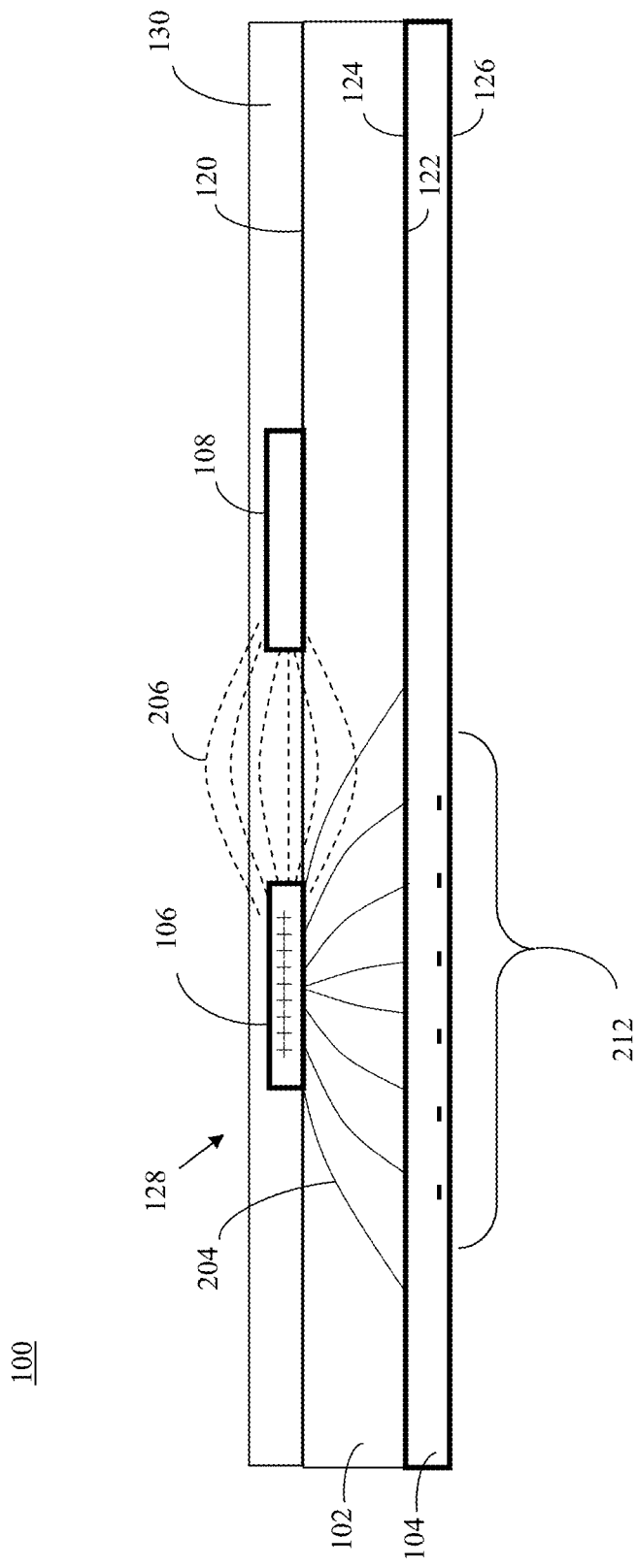
FIG. 2 shows a cross-sectional view of a circuit board that includes a transmission line, and shows electric fields related to the transmission line.

FIG. 2 shows example electric fields related to the operation of first electrical conductor 106. FIG. 2 shows a first electric field 204 radiating between first electrical conductor 106 and reference plane layer 104. In the example of FIG. 2, first electrical conductor 106 is shown as having a positive charge, and reference plane layer 104 is shown as having a negative charge (in a return current portion 212). First electric field 204 is shown mainly radiating through dielectric material layer 102. FIG. 2 also shows a second electric field 206 radiating between first electrical conductor 106 and second electrical conductor 108. Second electric field 206 is shown radiating through dielectric material layer 102, insulating layer 130, and an air space above circuit board 100.

The mutual capacitance between two signal conductors is related to the effective dielectric constant of the material between them. Thus, the mutual capacitance between first electrical conductor 106 and second electrical conductor 108 is related to the effective dielectric constant of dielectric material layer 102, insulating layer 130, and the air space. The shortest path between first electrical conductor 106 and second electrical conductor 108 is through insulating layer 130, and thus insulating layer 130 is a significant determiner of the effective dielectric constant. The mutual capacitance between two signal traces increases as the routing density increases (e.g., as the spacing between them decreases). For circuit board 100, a proximity of reference plane layer 104 to conductors 106 and 108 aids in reducing mutual capacitance. However, as mentioned above, manufacturing challenges and impedance control requirements may pose limitations on how close reference plane 104 can be located to conductors 106 and 108. As a result, there tends to be some amount of mutual capacitance between adjacent signal traces on a circuit board. Furthermore, as the logic noise margins of transmission line signals are reduced, a system level crosstalk budget is also reduced.

Reference layer 104 may be connected to a ground or voltage reference potential, and may be located above or below one or more signal traces of the circuit board. Such a reference layer configuration aids in controlling a characteristic impedance of transmission lines, a crosstalk between adjacent signal traces, and an electromagnetic interference (EMI) radiation emanating from the transmission lines, by confining the electric and magnetic fields in a smaller region around the transmission lines. However, implementing one or more reference planes in a circuit board leads to an increase in the number of metal layers in the circuit board. The increase in the number of metal layers increases a cost and a thickness of the circuit board. Such cost and thickness increases are not desired, especially for consumer electronics devices and systems that need to be thin and have dwindling average selling prices.

Embodiments of the present invention overcome deficiencies of conventional circuit boards, enabling reduced magnetic and electric field distributions, which enable reduced crosstalk and EMI radiation, and enable circuit boards having a reduced thickness and cost. Example embodiments are described in the following section.

Example Embodiments

Example embodiments for reducing magnetic field and electric field distributions in circuit boards are described in this section. In embodiments, a layer of electrically conductive material is formed over one or more traces on a circuit board. The layer of electrically conductive material is configured to confine the magnetic and electric field distributions associated with the one or more traces. The layer of electrically conductive material reduces the magnetic and electric field distribution, while resulting in a lower increase in circuit board cost and thickness relative to conventional techniques.

The example embodiments described herein are provided for illustrative purposes, and are not limiting. Although described below with reference to printed circuit boards (PCBs) and integrated circuit package substrates, the examples described herein may be adapted to other types of circuit boards. Furthermore, additional structural and operational embodiments, including modifications/alterations, will become apparent to persons skilled in the relevant art(s) from the teachings herein.

Figure 3:
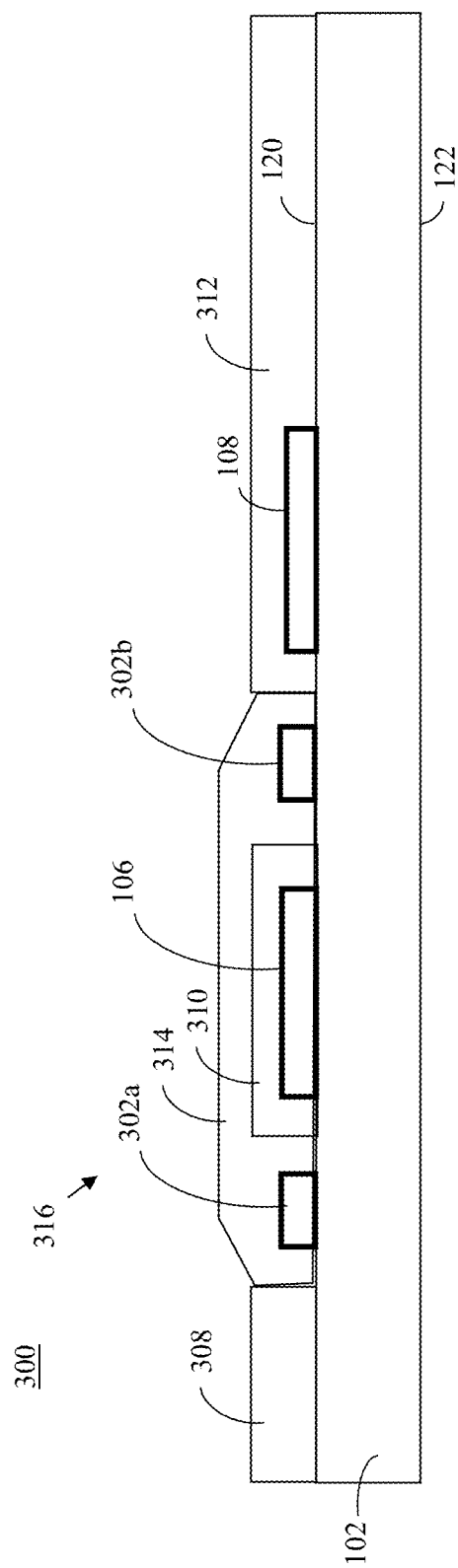
FIG. 3 shows a cross-sectional view of a circuit board, according to an example embodiment of the present invention.

FIG. 3 shows a cross-sectional view of a circuit board 300, according to an example embodiment of the present invention. Circuit board 300 is similar to circuit board 100 shown in FIG. 1, with differences described below. As shown in FIG. 3, circuit board 300 includes dielectric material layer 102 and first and second electrical conductors 106 and 108. Furthermore, circuit board 300 includes first, second, and third electrically insulating material portions 308, 310, and 312, a first electrically conductive feature 302a, a second electrically conductive feature 302b, and an electrically conductive material 314. These features of circuit board 300 are described as follows.

As shown in FIG. 3, first and second electrically conductive features 302a and 302b are on first surface 120 of dielectric material layer 102. First electrical conductor 106 is also on first surface 120 between first and second electrically conductive features 302a and 302b. First, second, and third electrically insulating material portions 308, 310, and 312 are on first surface 120. First, second, and third electrically insulating material portions 308, 310, and 312 may be isolated sections of a layer of electrically insulating material, or may be portions of a continuous layer of electrically insulating material. Electrically insulating material portion 310 covers electrical conductor 106. Electrically conductive material 314 is formed on electrically insulating material portion 310, and is in electrical contact with first and second electrically conductive features 302a and 302b. Electrically conductive material 314 is electrically isolated from electrical conductor 106 by electrically insulating material portion 310.

As shown in FIG. 3, first electrically conductive feature 302a, electrical conductor 106 (covered by electrically insulating material portion 310), and second electrically conductive feature 302b are between first electrically insulating material portion 308 and third electrically insulating material portion 312 on first surface 120 of dielectric material layer 102. Third electrically insulating material portion 312 covers second electrical conductor 108 on first surface 120. Electrical conductor 106 and electrically conductive material 314 form a transmission line 316 similar to transmission line 128 formed by electrical conductor 106 and reference plane 104 shown in FIG. 1, but with improved electrical and magnetic characteristics.

Electrically conductive material 314 provides for improved confinement of the electrical and magnetic fields generated by transmission line 316, relative to the electrical and magnetic fields generated by transmission line 128 shown in FIG. 1. Such improvements are due to the closer proximity of electrically conductive material 314 and electrical conductor 106 (relative to reference plane 104 and electrical conductor 106, the shielding provided by electrically conductive material 314 to electrical conductor 106, and/or for further reasons described herein, depending on the particular implementation.

Figure 4:
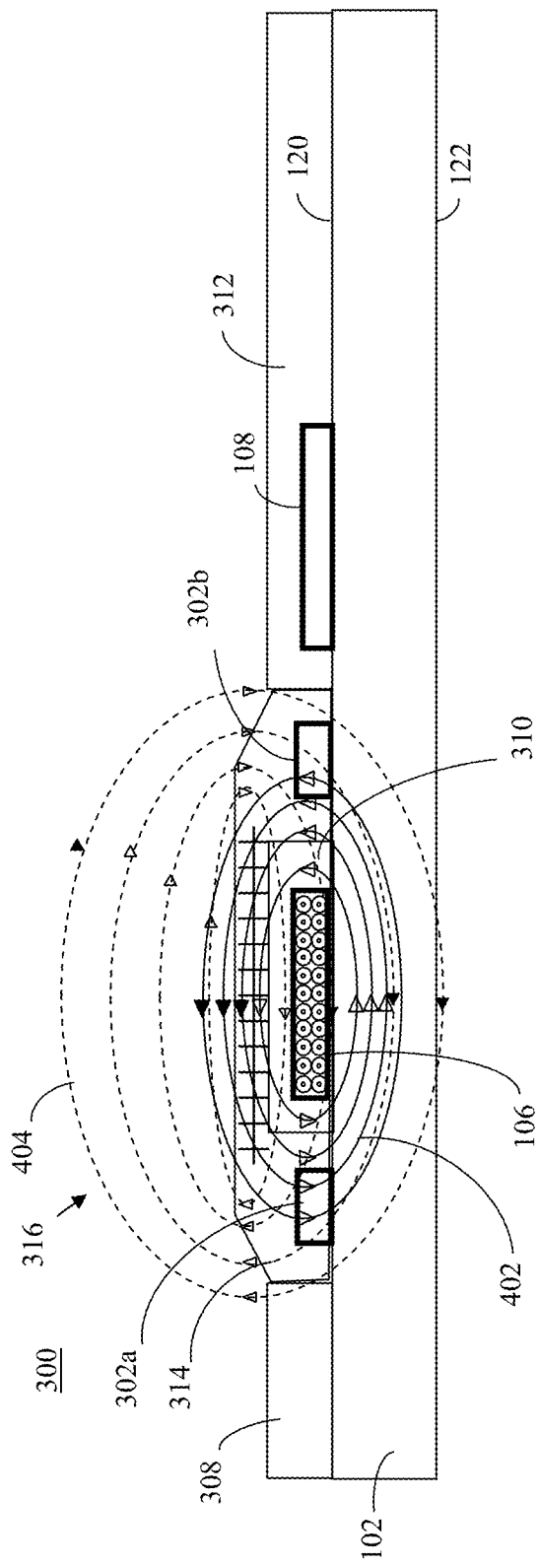
FIG. 4 shows a cross-sectional view of the circuit board of FIG. 3, and shows related magnetic fields, according to an example embodiment of the present invention.
Figure 5:
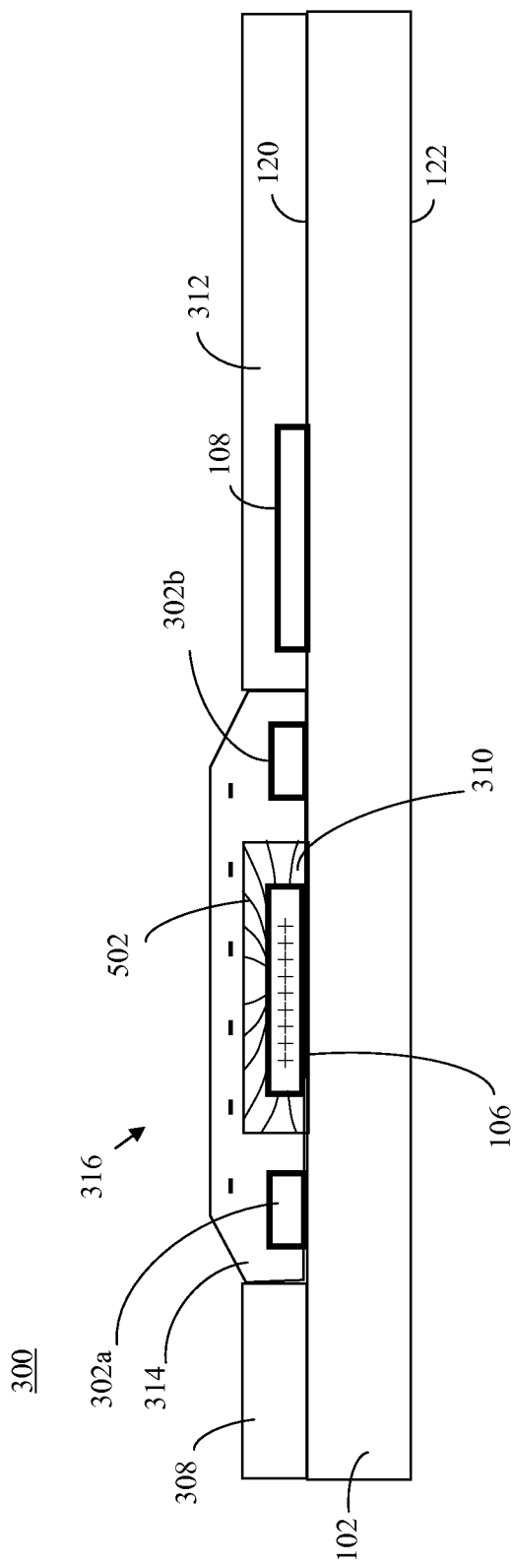
FIG. 5 shows a cross-sectional view of the circuit board of FIG. 3, and shows related electric fields, according to an example embodiment of the present invention.

For instance, FIGS. 4 and 5 show cross-sectional views of circuit board 300, where FIG. 4 shows magnetic fields related to circuit board 300, and FIG. 5 shows electric fields related to circuit board 300, according to example embodiments of the present invention. Referring to FIG. 4, first electrical conductor 106 carries an electrical signal (e.g., a forward current) of transmission line 316, and electrically conductive material 314 carries a return current of transmission line 316. In the example of FIG. 4, a direction of the forward electrical current of the electrical signal flowing through first electrical conductor 106 is indicated as flowing out of the page, and a direction of the return current flowing through electrically conductive material 314 is indicated as flowing into the page. A net magnetic field around transmission line 316 is a vectorial sum of a first magnetic field 402 due to the forward current on first electrical conductor 106 and a second magnetic field 404 due to the return current on electrically conductive material 314. Due to the "right hand rule," first magnetic field 402 has a counter clockwise direction around first electrical conductor 106, and second magnetic field 404 has a clockwise direction.

Electrically conductive material 314 can be formed closer to electrical conductor 106 than reference plane 104 and electrical conductor 106 can be positioned relative to each other in FIG. 1. This is because electrically insulating material portion 310 can be formed to have a thickness that is less than a thickness of dielectric material layer 102. Because electrically conductive material 314 and electrical conductor 106 can be formed more closely together than reference plane 104 and electrical conductor 106 shown in FIG. 1, first and second magnetic fields 402 and 404 cancel each other at locations around transmission line 316 better than first and second magnetic fields 110 and 112 can cancel at locations around transmission line 128 shown in FIG. 1. As a result, the net magnetic field from transmission line 316 fringes less with adjacent transmission lines (e.g., a transmission line that includes second conductor 108) than does the net magnetic field from transmission line 128 shown in FIG. 1.

FIG. 5 shows an electric field 502 related to the operation of first electrical conductor 106 and electrically conductive material 314. Electric field 502 radiates between first electrical conductor 106 and electrically conductive material 314. In FIG. 5, first electrical conductor 106 is shown as having a positive charge, and electrically conductive material 314 is shown as having a negative charge. Electric field 502 is shown radiating through electrically insulating material portion 310.

Figure 11:
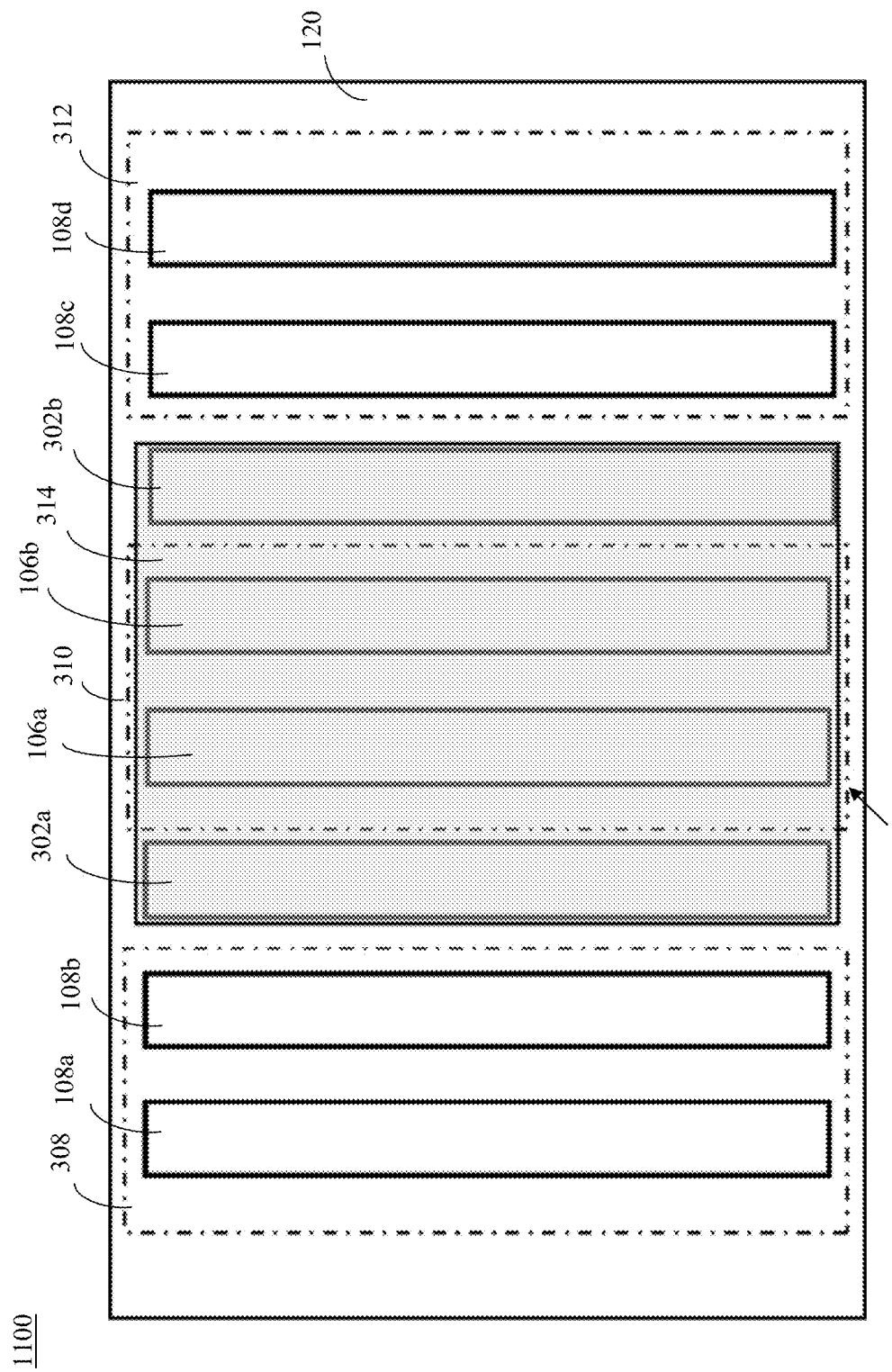

As described above, the mutual capacitance between two signal conductors is related to the effective dielectric constant of the material between them. In an embodiment, first and second electrically conductive features 302a and 302b may be traces that extend along the length of electrical conductor 106 (e.g., in the directions in and/or out of the page) (e.g., as shown in FIG. 11, described below). In such an embodiment, the shortest path between first electrical conductor 106 and second electrical conductor 108 is through electrically insulating material portion 310 and electrically conductive material 314. Because electrically conductive material 314 is positioned between first electrical conductor 106 and second electrical conductor 108, there will be little to no mutual capacitance between them, and therefore little signal strength for electrical field 502 between first and second electrical conductors 106 and 108. Thus, in this embodiment, transmission line 316 has reduced crosstalk with electrical conductor 108 relative to transmission line 128 shown in FIG. 2.

Figure 10:
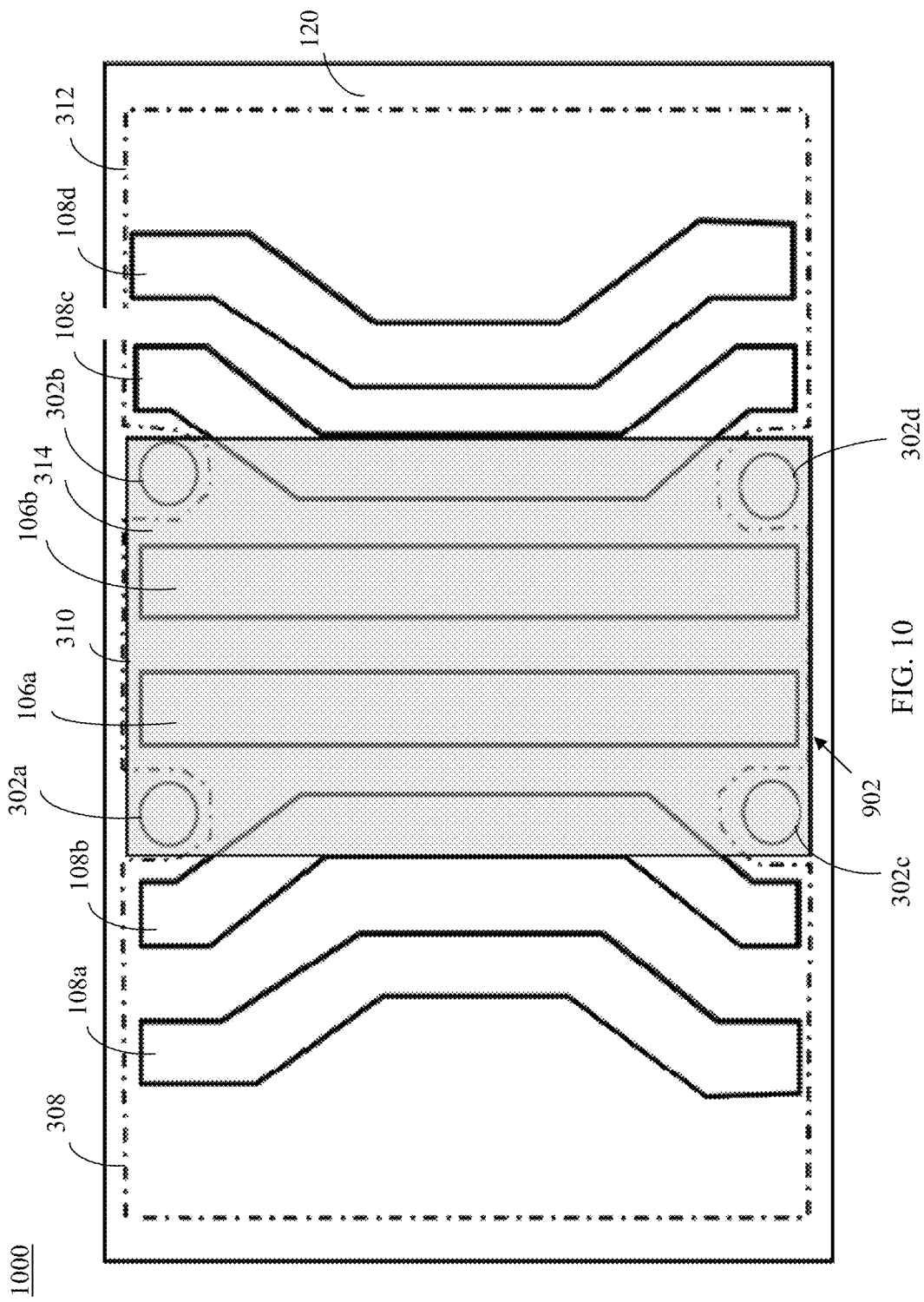
FIGS. 10-13 show top views of portions of example circuit boards, according to embodiments of the present invention.

In another embodiment, first and second electrically conductive features 302a and 302b may not extend along the length of electrical conductor 106 (e.g., as shown in FIG. 10, described below). In such an embodiment, at some locations, the shortest path between first electrical conductor 106 and second electrical conductor 108 may be through electrically insulating material portion 310 and electrically insulating material portion 312 (which may be separate or continuous portions). However, even in such an embodiment, the close proximity of electrically conductive material 314 to electrical conductor 106 aids in reducing mutual capacitance relative to reference plane 104 and electrical conductor 106 shown in FIG. 2. Thus, in this embodiment, transmission line 316 has reduced crosstalk with electrical conductor 108 relative to transmission line 128 shown in FIG. 2.

Due to the reduced magnetic field and electric field distributions enabled by electrically conductive material 314, a crosstalk is reduced between adjacent signal traces, and an electromagnetic interference (EMI) radiation emanating from transmission lines is reduced. Furthermore, the reduced magnetic field an electric field distributions are enabled without substantially increasing a thickness of circuit board 300. For example, circuit board 300 may have a thickness that is less than a thickness of circuit board 100 shown in FIG. 1 because circuit board 300 does not include reference plane 104 shown in FIG. 1, and a thickness of electrically conductive material 314 (extending beyond the thickness of electrically insulating material portions 308, 310, and 312) is less than a thickness of reference plane 104. Furthermore, a manufacturing cost of circuit board 300 may be less than a manufacturing cost of circuit board 100 due to the elimination of reference layer 104, and the relatively low complexity manufacturing techniques that may be used to form electrically conductive material 314 on circuit board 300. Due to these reductions in costs and thickness, embodiments enable less expensive and smaller electronic devices to be manufactured.

Note that although a reference layer (e.g., reference layer 104) is not shown in FIGS. 3-5 for circuit board 300, one or more reference layers may optionally be present in circuit board 300 to provide for additional reductions in the magnetic field and electric field distributions of transmission line 316 and/or other signal traces of circuit board 300.

Embodiments of the present invention, including circuit board 300, may be formed in various ways. For example, FIG. 6 shows a flowchart 600 for forming a circuit board, according to an example embodiment of the present invention. Flowchart 600 may be used to form circuit board 300, for instance. Flowchart 600 is described with respect to FIGS. 7 and 8, which show circuit board 300 at different points during a fabrication process, according to example embodiments. Note that a single circuit board may be formed according to flowchart 600, or a plurality of circuit boards may be formed in parallel according to flowchart 600. For example, an array of circuit boards may be formed in a panel, in an embodiment. Other structural and operational embodiments will be apparent to persons skilled in the relevant art(s) based on the discussion regarding flowchart 600.

Figure 7:
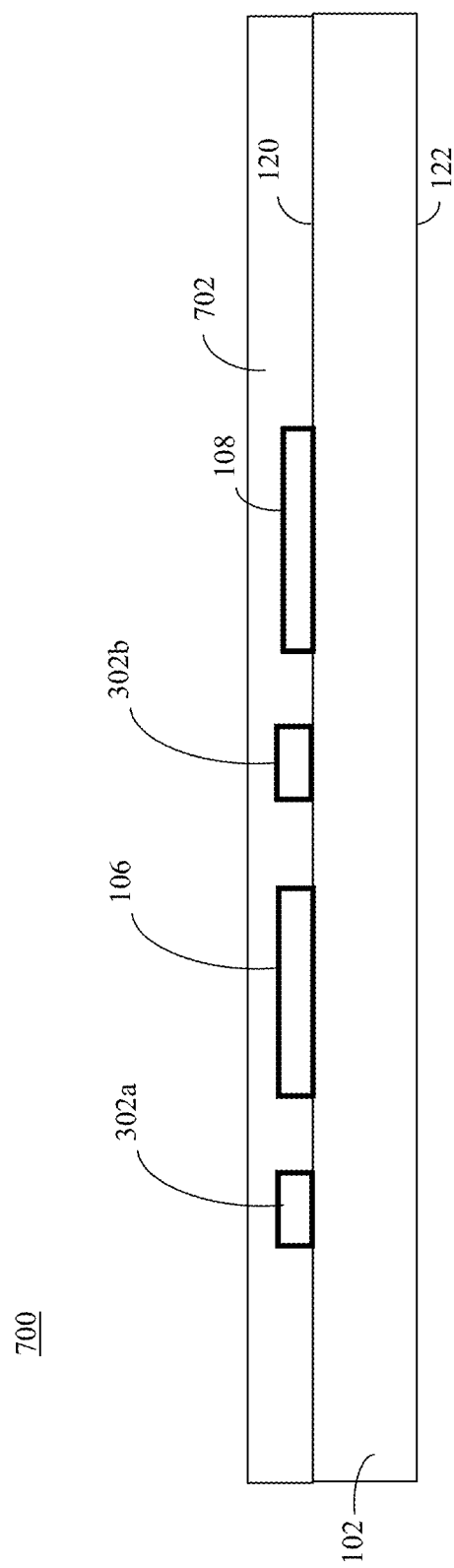
FIGS. 7 and 8 show cross-sectional views of the circuit board of FIG. 3 at different points during an example fabrication process, according to embodiments of the present invention.

In step 602, a first electrically conductive feature, a second electrically conductive feature, and an electrically conductive trace are formed on a first surface of a dielectric material layer, the electrically conductive trace being positioned between the first and second electrically conductive features. For instance, the first electrically conductive feature may be first electrically conductive feature 302a, the second electrically conductive feature may be second electrically conductive feature 302b, and the electrically conductive trace may be first electrical conductor 106. As shown in FIG. 7, first electrically conductive feature 302a, second electrically conductive feature 302b, and electrical conductor 106 are formed on first surface 120 of dielectric material layer 102. As further shown in FIG. 7, electrical conductor 106 is positioned between first and second electrically conductive features 302a and 302b. Furthermore, electrical conductor 108 is formed on the first surface 120. Second electrically conductive feature 302b is positioned between first electrical conductor 106 and second electrical conductor 108.

Note that first electrical conductor 106, first electrically conductive feature 302a, and second electrically conductive feature 302b may be formed during a same fabrication process or separate fabrication processes. First electrical conductor 106, first electrically conductive feature 302a, and second electrically conductive feature 302b may be formed in any manner, conventional or otherwise, as would be known to persons skilled in the relevant art(s), such as a photolithography process. For example, first electrical conductor 106, first electrically conductive feature 302a, and second electrically conductive feature 302b may be formed from a sheet that includes one or more layers of electrically conductive material(s), such as a metal foil. An etching process or other process may be used to define first electrical conductor 106, first electrically conductive feature 302a, second electrically conductive feature 302b (and second electrical conductor 108) in the sheet (e.g., in the shape of a trace, a conductive pad, etc.). First electrical conductor 106, first electrically conductive feature 302a, second electrically conductive feature 302b, and second electrical conductor 108 may be formed of a metal, such as copper, aluminum, gold, silver, tin, nickel, lead, or a combination of metals/alloy, or may be formed of an alternative electrically conductive material. First electrical conductor 106, first electrically conductive feature 302a, second electrically conductive feature 302b, and second electrical conductor 108 may be attached to dielectric material layer 102 in any manner, including using an adhesive material (e.g., an epoxy), by a lamination process, or in any other suitable manner, as would be known to persons skilled in the relevant art(s).

In step 604 shown in FIG. 6, a layer of an electrically insulating material is formed on the first surface of the dielectric material that covers at least a portion of the electrically conductive trace. For instance, FIG. 7 shows a circuit board 700, which is partially formed version of circuit board 300. As shown in the example of FIG. 7, insulating layer 702 is formed on second surface 120 of dielectric material layer 102. Insulating layer 702 may be similar to insulating layer 130 shown in FIG. 1, for example. Insulating layer 702 covers first and second electrical conductors 106 and 108 and first and second electrically conductive features 302a and 302b on dielectric material layer 102. Insulating layer 702 may be any suitable insulating/dielectric material, such as an epoxy, a mold compound, and/or a plastic or polymer layer, such as a solder mask layer. Insulating layer 702 may be formed in any manner, as would be known to persons skilled in the relevant art(s). For example, insulating layer 702 may be formed according to a spraying process, a silkscreen process, a vacuum lamination process, or any other suitable process, as would be known to persons skilled in the relevant art(s). Insulating layer 702 may be applied to dielectric material layer 10 to provide a protective coating for first and second electrical conductors 106 and 108 to avoid short circuits, to facilitate automatic surface mount attachment of chips/devices on circuit board 300 (e.g., using solder reflow), and/or for other purpose.

Figure 8:
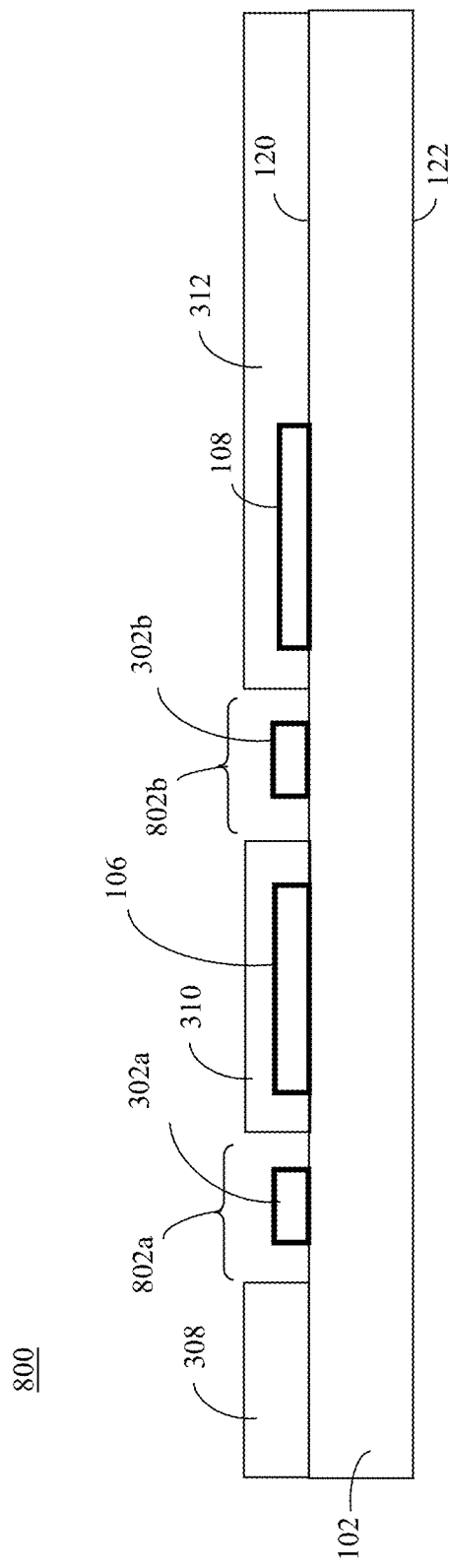

FIG. 8 shows a circuit board 800, which is a version of circuit board 700 with the addition of openings 802a and 802b. Opening 802a is formed through insulating layer 702 shown in FIG. 7 at first electrically conductive feature 302a to provide access to first electrically conductive feature 302a. Opening 802b is formed through insulating layer 702 shown in FIG. 7 at second electrically conductive feature 302b to provide access to second electrically conductive feature 302b. Thus, in an embodiment, step 604 of FIG. 6 may include the step of forming openings through the electrically insulating material at the first and second electrically conductive features. Openings 802a and 802b may be formed through insulating layer 702 in any manner, including by forming insulating layer 702 in a pattern that includes openings 802a and 802b, by etching openings 802a and 802b through insulating layer 702, by drilling openings 802a and 802b through insulating layer 702, or by any other suitable process. Openings 802a and 802b may each be formed to have any suitable area and shape, including having an area configured to expose only a portion of a corresponding one of first and second electrically conductive features 302a and 302b, having an area substantially equal to an area of the corresponding one of first and second electrically conductive features 302a and 302b, or having an area substantially greater than an area of the corresponding one of first and second electrically conductive features 302a and 302b (as shown in FIG. 8). For example, openings 802a and 802b may be circular or rectangular openings to expose first and second electrically conductive features 302a and 302b, which may be contact pads or similar structures. In another embodiment, openings 802a and 802b may be elongated openings to expose first and second electrically conductive features 302a and 302b, which may be traces or other elongated structures extending along first surface 120. As shown in FIG. 8, opening 802a separates first electrically insulating material portion 308 from second electrically insulating material portion 310, and opening 802b separates second electrically insulating material portion 310 from third electrically insulating material portion 312.

Figure 9:
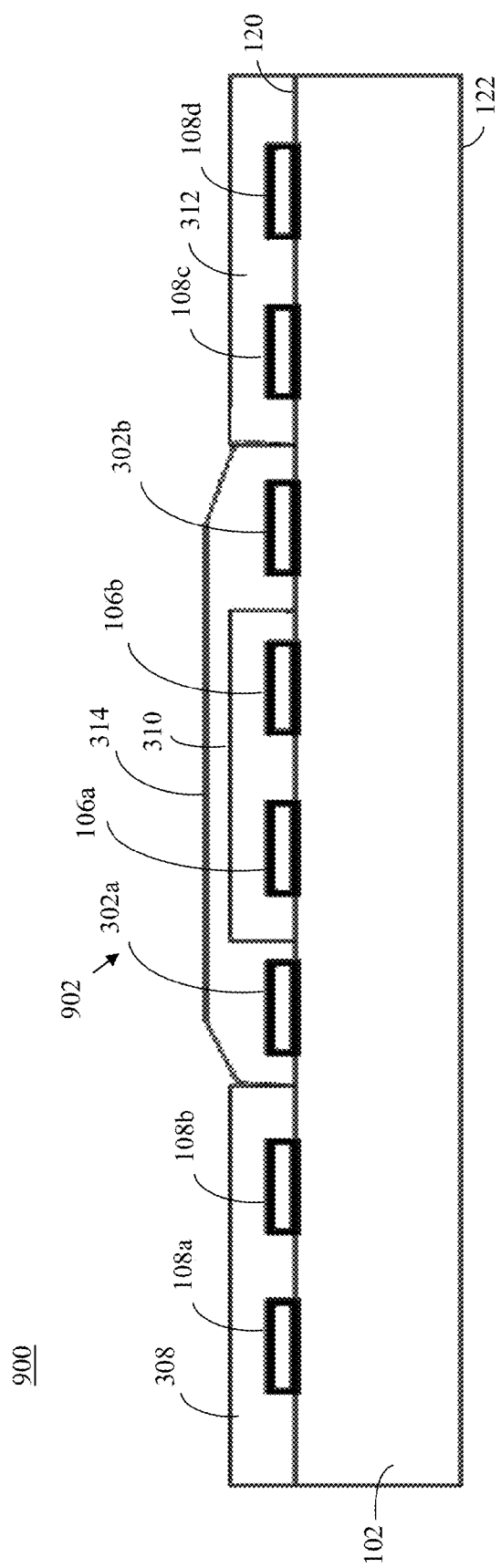
FIG. 9 shows a cross-sectional view of a circuit board, according to an example embodiment of the present invention.

In step 606 shown in FIG. 6, a layer of an electrically conductive material is formed on the electrically insulating material and in electrical contact with the first and second electrically conductive features. For example, as shown in FIG. 9, electrically conductive material 314 may be formed on first electrically conductive feature 302a, second electrically insulating material portion 310, and second electrically conductive feature 302b to form circuit board 300 shown in FIG. 3. The layer of electrically conductive material 314 may be formed as a planar layer or a non-planar layer (e.g., as shown in FIG. 9, where outer edges of electrically conductive material 312 taper downward towards surfaces of insulating material portions 308 and 312). Electrically conductive material 314 is in electrical contact with first and second electrically conductive features 302a and 302b through openings 802a and 802b, respectively, shown in FIG. 8.

Electrically conductive material 314 may be formed on a circuit board in any suitable manner, including by a plating process, a deposition process, a screen printing process, or an ink-jet printing process. Electrically conductive material 314 may be applied in a solid form or in a liquid form that may be subsequently cured to form a solid. Electrically conductive material 314 may be an electrically conductive material such as an electrically conductive polymer or a metal such as copper, aluminum, gold, silver, tin, nickel, lead, or a combination of metals/alloy, or may be formed of an alternative electrically conductive material. For example, electrically conductive material 314 may be a metal foil, a metallic paint, a lead frame, an electrically conductive resin or epoxy, an electrically conductive ink, an electrically conductive paste (e.g., a solder paste), or other suitable electrically conductive material. For instance, electrically conductive material 314 may be a metal foils attached using an electrically conductive adhesive to make contact with first and second electrically conductive features 302a and 302b. Excess portions of the metal foils may be removed, such as by an etching process.

Electrically conductive material 314 can be formed to have any suitable thickness. The thickness of electrically conductive material 314 may be formed and controlled to an accuracy within a few micrometers, within sub-micrometer range, or within other range, such that electrically conductive material 314 may have a small or even negligible impact on the overall thickness of the integrated circuit package or other circuit board application compared to adding a separate metal layer itself (e.g., by adding a reference layer 104 shown in FIG. 1).

Note that although a single electrical conductor 106 is shown in FIG. 3 as being located between first and second electrically conductive features 302a and 302b and covered by electrically conductive material 314, one or more additional electrical conductors may be present between first and second electrically conductive features 302a and 302b and covered by electrically conductive material 314. For instance, FIG. 9 shows a cross-sectional view of a circuit board 900 having a transmission line 902, according to an example embodiment of the present invention. Transmission line 902 includes electrical conductor 106a and electrical conductor 106b. As shown in FIG. 9, six electrical conductors 106a, 106b, 108a, 108b, 108c, and 108d are positioned on first surface 120 of dielectric material layer 102. Furthermore, first and second electrically conductive features 302a and 302b are positioned on first surface 120. First and second electrical conductors 106a and 106b are positioned adjacent to each other, and are covered by second insulating material portion 310. Electrical conductors 108a and 108b are positioned adjacent to each other and are covered by first insulating material portion 308. Electrical conductors 108c and 108d are positioned adjacent to each other and are covered by third insulating material portion 312. For example, electrical conductors 108a and 108b may form a second transmission line of circuit board 900, and electrical conductors 108c and 108d may form a third transmission line of circuit board 900.

Electrical conductors 106a and 106b are positioned between first and second electrically conductive features 302a and 302b on first surface 120. First electrically conductive feature 302a is positioned between electrical conductor 108b and electrical conductor 106a, and second electrically conductive feature 302b is positioned between electrical conductor 106b and electrical conductor 108c.

In FIG. 9, electrically conductive material 314 is formed over first electrically conductive feature 302a, electrically insulating material portion 310, and second electrically conductive feature 302b, and is in electrical contact with first and second electrically conductive features 302a and 302b. Electrically conductive material 314 confines the electric and magnetic fields generated by signals transmitted by transmission line 902 in a similar fashion as described above with respect to transmission line 316 in FIGS. 4 and 5. For example, because electrical conductors 106a and 106b are closely adjacent to each other, being separated by a relatively thin electrically insulating material portion 310, electrical conductors 106a and 106b remain relatively tightly electrically and magnetically coupled. Furthermore, because electrically conductive material 314 is positioned closely to electrical conductors 106a and 106b, and electrically conductive material 314 may be (in some embodiments) positioned between transmission line 902 and adjacent electrical conductors 108b and 108c, electrically conductive material 314 provides EMI shielding for transmission line 902, reduces a magnetic field fringing with electrical conductors 108b and 108c, and reduces a mutual capacitance between transmission line 902 and electrical conductors 108b and 108c.

As described above, electrically conductive features 302a and 302b may have elongated or non-elongated shapes. Furthermore, any number of electrically conductive features may be present. For instance, FIG. 10 shows a top view of a portion of a circuit board 1000, showing first surface 120 of circuit board 1000, according to an example embodiment of the present invention. Circuit board 1000 is an example of circuit board 300 shown in FIG. 3. As shown in FIG. 10, electrical conductors 106a, 106b, 108a, 108b, 108c, and 108d are positioned on first surface 120. Furthermore, first-fourth electrically conductive features 302a, 302b, 302c, and 302d are positioned on first surface 120. First-third insulating material portions 308, 310, and 312 are shown as transparent in FIG. 10 for ease of illustration. First-third insulating material portions 308, 310, and 312 form a continuous insulating material layer on first surface 120 (with openings at electrically conductive features 302a, 302b, 302c, and 302d). Electrically conductive material 314 is shown as transparent and shaded in FIG. 10 for ease of illustration.

Similarly to the embodiment of FIG. 9, first and second electrical conductors 106a and 106b are positioned adjacent to each other, and are covered by second insulating material portion 310. Electrical conductors 108a and 108b are positioned adjacent to each other, and are covered by first insulating material portion 308. Electrical conductors 108c and 108d are positioned adjacent to each other, and are covered by third insulating material portion 312. Electrical conductors 106a and 106b are positioned between first and second electrically conductive features 302a and 302b on first surface 120. First electrically conductive feature 302a is positioned between electrical conductor 108b and electrical conductor 106a, and second electrically conductive feature 302b is positioned between electrical conductor 106b and electrical conductor 108c. Electrically conductive material 314 is formed over first electrically conductive feature 302a, electrically insulating material portion 310, and second electrically conductive feature 302b, and is in electrical contact with first and second electrically conductive features 302a and 302b.

Note that in FIG. 10, portions of electrical conductors 106a, 106b, 108a, 108b, 108c, and 108d, electrically insulating material portions 308, 310, and 312, and electrically conducting material 314 may be shown, and thus may have additional portions on portions of circuit board 1000 not visible in FIG. 10. In the example of FIG. 10, electrical conductors 106a, 106b, 108a, 108b, 108c, and 108d are electrically conductive traces, and electrically conductive features 302a, 302b, 302c, and 302d are electrically conductive pads. Electrical conductors 106a and 106b are substantially straight traces, and electrical conductors 108a, 108b, 108c, and 108d are curved traces that are each formed of multiple straight trace portions joined together by angled portions. In FIG. 10, electrically conductive material 314 forms a rectangular shaped layer over electrically insulating material portion 310, electrical conductors 106a and 106b, and electrically conductive features 302a-302d. Each of electrically conductive features 302a, 302b, 302c, and 302d is located under a corresponding corner of electrically conductive material 314 in FIG. 10. Electrically conductive material 314 is electrically isolated from electrical conductors 106a and 106b by electrically insulating material portion 310, and is in electrical contact with each of electrically conductive features 302a, 302b, 302c, and 302d. Furthermore, a portion of electrical conductor 108b curves under a first edge of electrically conductive material 314, and a portion of electrically conductor 108c curves under a second edge of electrically conductive material 314.

In the example of FIG. 10, electrically conductive features 302a, 302b, 302c, and 302d are each shown as having a circular shape. In alternative embodiments, electrically conductive features 302a, 302b, 302c, and 302d may have alternative shapes, including being rectangular, triangular, other polygon, or an irregular shape. Electrically conductive features 302a, 302b, 302c, and 302d may have sizes (e.g., a diameter, a length and/or width, etc.) that are equal to, less than, or greater than width of electrical conductors 106a and 106b. Furthermore, any number of electrically conductive features may be present. For example, a row of electrically conductive features 302a, 302b, 302c, and 302d may be present arranged along a length of transmission line 902 along each side of transmission line 902.

FIG. 11 shows a top view of a portion of a circuit board 1100, showing first surface 120 of circuit board 1100, according to an example embodiment of the present invention. Circuit board 1100 is another example of circuit board 300 shown in FIG. 3, and is generally the same as circuit board 1000, with differences described as follows. As shown in FIG. 11, electrical conductors 106a, 106b, 108a, 108b, 108c, and 108d are all shown as substantially straight electrically conductive traces. Furthermore, first and second electrically conductive features 302a and 302b are shown as substantially straight electrically conductive traces (electrically conductive features 302c and 302d are not present in FIG. 11). First-third insulating material portions 308, 310, and 312 are shown as transparent in FIG. 11 for ease of illustration. Electrically conductive material 314 is shown as transparent and shaded in FIG. 11 for ease of illustration.

Electrically insulating material portions 308, 310, and 312 are separated from each other in circuit board 1100 by gaps. Electrically conductive features 302a and 302b each extend along a respective side of the length of transmission line 902. Electrically conductive material 314 is electrically isolated from electrical conductors 106a and 106b by electrically insulating material portion 310, and is in electrical contact with both of electrically conductive features 302a and 302b along their entire lengths (through the gap between electrically insulating material portions 308 and 310, and the gap between portions 310 and 312). No portion of any of electrical conductors 108a, 108b, 108c, and 108d extends under electrically conductive material 314 in the example embodiment of FIG. 11. For illustrative purposes, FIG. 12 shows the top view of the portion of circuit board 1100 shown in FIG.

11, with electrically insulating material portions 308, 310, and 312, and electrically conductive material 314 being shown as not transparent.

Figure 12:
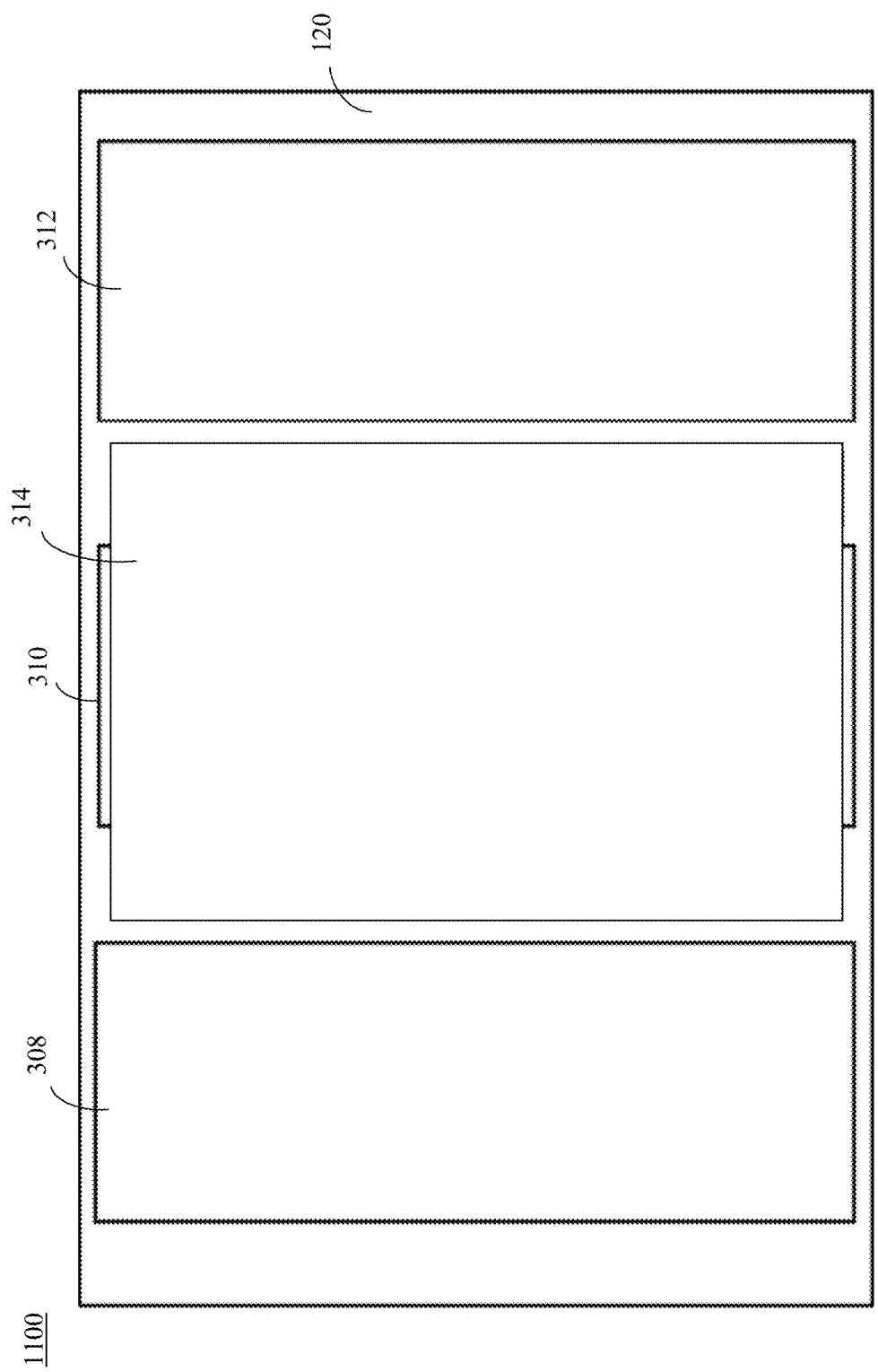
Figure 13:
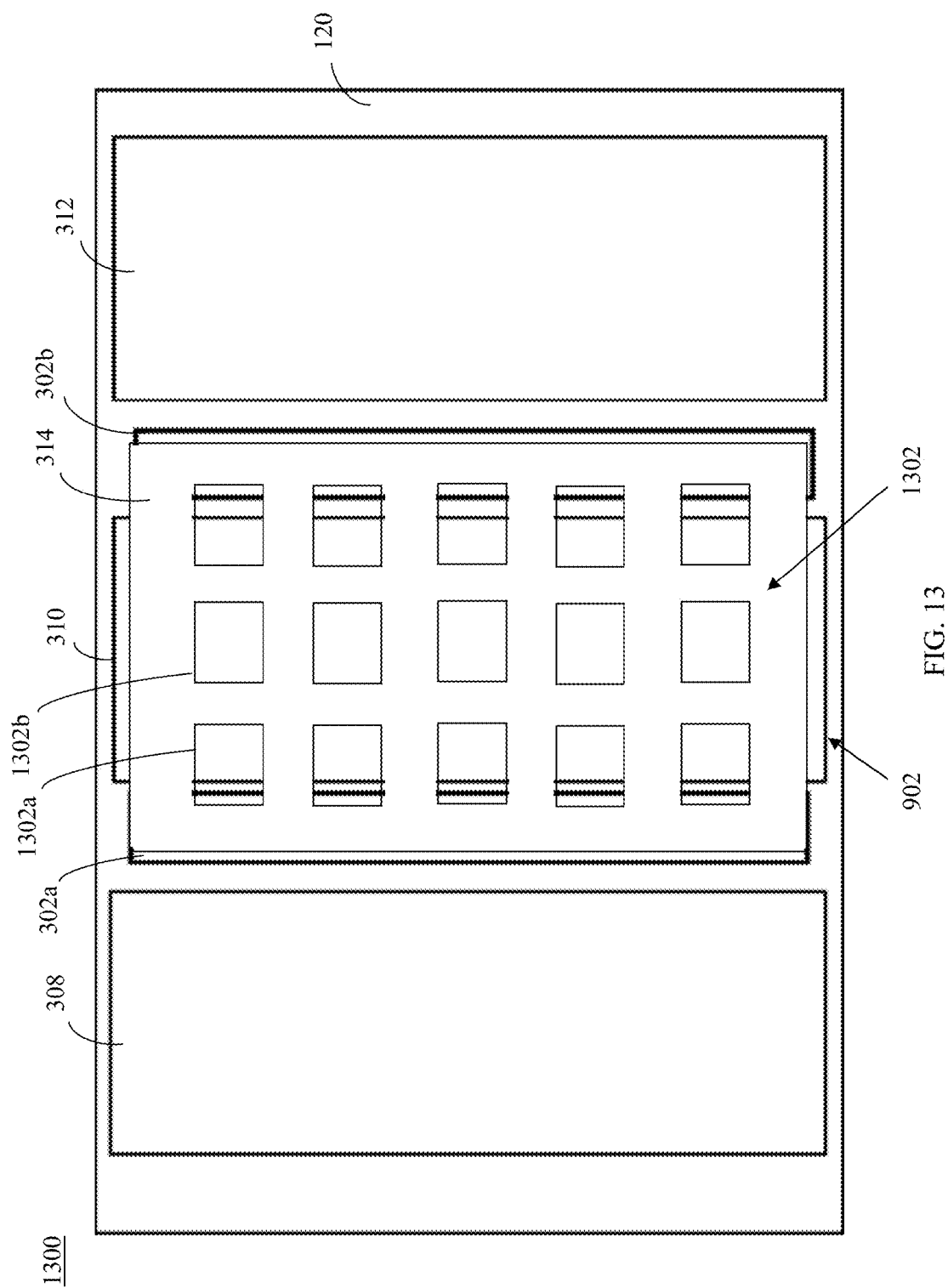

In an embodiment, such as shown in FIG. 12, electrically conductive material 314 may form a continuous layer. In another embodiment, electrically conductive material 314 may include one or more openings. For example, FIG. 13 shows a view of a portion of a circuit board 1300, according to an example embodiment of the present invention. Circuit board 1300 is another example of circuit board 300 shown in FIG. 3, and is generally the same as circuit board 1100, with differences described as follows. As shown in FIG. 13, electrically conductive material 314 is formed in a grid shape, having a plurality of rectangular openings 1302, including openings 1302a and 1302b, arranged in an array. As shown in FIG. 13, portions of electrically insulating material portion 310, first surface 120, and/or first and second electrically conductive features 302a and 302b may be accessible through openings 1302. Any number, shape, and arrangement of openings 1302 may be present. Openings 1302 may have any size, including a size configured to shield external entities from signals radiated from transmission line 902, and to shield transmission line 902 from signals radiated from external entities.

The grid shape of electrically conductive material 314 may be useful in embodiments where a coating material is applied to first surface 120 of circuit board 1300 to cover electrically conductive material 314 and/or other features on first surface 120, such as in an over-molding process. For example, the coating material may be a molding compound, an encapsulating material, or other coating material used to provide environmental protection to circuit board 1300. Openings 1302 in electrically conductive material 314 enable the coating material to adhere to portions of electrically insulating material portion 310, first surface 120, and/or first and second electrically conductive features 302a and 302b that are accessible through openings 1302. In this manner, the coating material may adhere more strongly to circuit board 1300.

In embodiments, one or more electrically conductive features 302 may be electrically coupled to an electrical potential of the circuit board, such as being electrically coupled to a signal net, for example, a ground signal net or a power signal net of the circuit board. In this manner, electrically conductive material 314 may be electrically coupled to the electrical potential (through the one or more electrically conductive features), to further improve the effectiveness of electrically conductive material 314 in confining the magnetic and electric fields generated by electrical conductors/transmission lines positioned adjacent to electrically conductive material 314 and between electrically conductive features. Electrically conductive features may be electrically coupled to an electrical potential of the circuit board by any one or a combination of signal traces or other electrical conductors, signal vias through one or more layers of the circuit board, etc.

Figure 14:
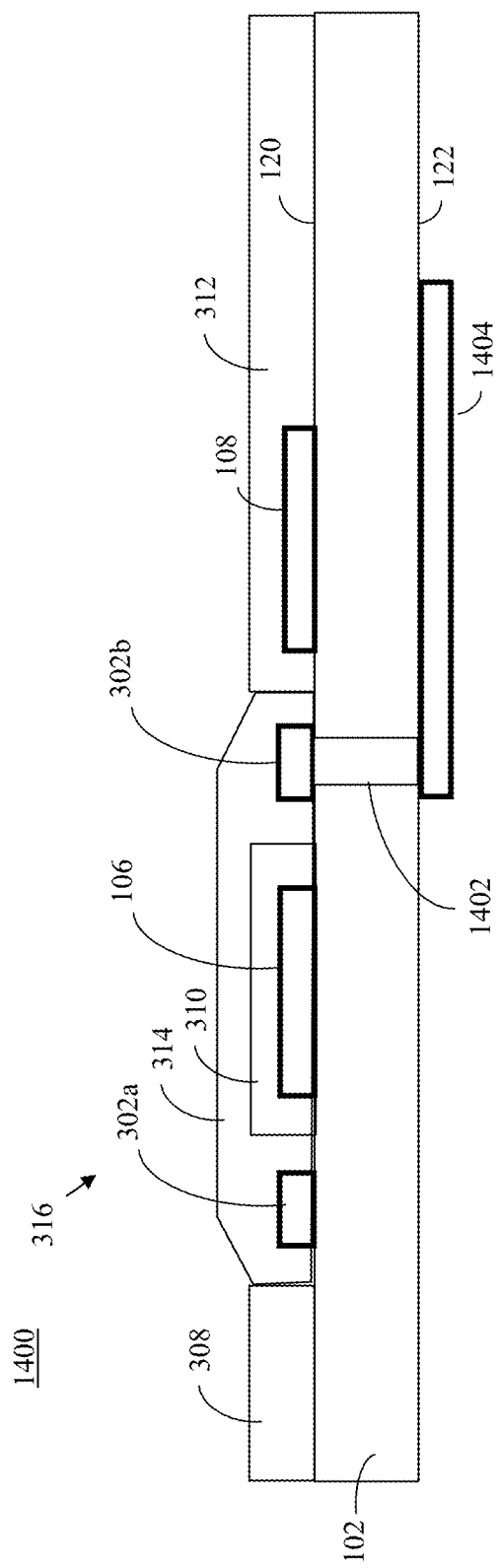
FIG. 14 shows a cross-sectional view of a circuit board, according to an example embodiment of the present invention.

For instance, FIG. 14 shows a cross-sectional view of a circuit board 1400, according to an example embodiment of the present invention. Circuit board 1400 is another example of circuit board 300 shown in FIG. 3, with differences described as follows. As shown in FIG. 14, an electrically conductive via 1402 is present that extends through dielectric material layer 102, and an electrically conductive trace 1404 is present on second surface 122 of dielectric material layer 102. Second electrically conductive feature 302b is coupled to a first end of electrically conductive via 1402 at first surface 120, and electrically conductive trace 1404 is coupled to a second end of electrically conductive via 1402 at second surface 122. Electrically conductive trace 1404 may be electrically coupled to a power or ground signal net of circuit board 1400 through further electrically conductive traces and/or vias, including being electrically coupled to a ground or power signal plane (e.g., reference plane 104 of FIG. 1) of circuit board 1400. In this manner, electrically conductive material 314 is electrically coupled to the power or ground signal net through second electrically conductive feature 302b, electrically conductive via 1402, and electrically conductive trace 1404. Although not shown in FIG. 14, first electrically conductive feature 302a may also be electrically coupled to the power or ground signal net in a similar or different fashion to second electrically conductive feature 302b.

As described above, circuit boards described herein (e.g., circuit boards 300, 900, 1000, 1100, 1300, 1400, etc.) may be used in printed circuit boards, integrated circuit packages, and further circuit board applications. For example, in a printed circuit board application, any number of electrical components, connectors, etc., may be mounted and/or attached to a circuit board described herein. In an integrated circuit package application, a circuit board described herein may be used as an integrated circuit package substrate. In embodiments, one or more integrated circuit dies, solder balls, wire bonds, an encapsulating material/mold compound, heat sink, etc., may be mounted/attached to the circuit board to form the integrated circuit package.

Example Embodiments

In an embodiment, a circuit board includes a dielectric material layer having opposing first and second surfaces, a first electrically conductive feature on the first surface of the dielectric material layer, a second electrically conductive feature on the first surface of the dielectric material layer, an electrically conductive trace on the first surface of the dielectric material layer between the first and second electrically conductive features, an electrically insulating material on the first surface of the dielectric material layer that covers at least a portion of the electrically conductive trace, and an electrically conductive material formed on the electrically insulating material and in electrical contact with the first and second electrically conductive features.

The electrically conductive material may be formed in a grid shape on the electrically insulating material.

The first electrically conductive feature may be a second electrically conductive trace, and the second electrically conductive feature may be a third electrically conductive trace.

The first electrically conductive feature may be a first electrically conductive pad, and the second electrically conductive feature may be a second electrically conductive pad.

The circuit board may further include a second electrically conductive trace adjacent to the first electrically conductive trace on the first surface of the dielectric material layer between the first and second electrically conductive features. The first and second electrically conductive traces may form a transmission line pair. The electrically insulating material may cover at least a portion of the second electrically conductive trace.

The electrically conductive material may be an electrically conductive epoxy or electrically conductive foil.

The first and second electrically conductive features may be electrically coupled to an electrical potential.

The electrical potential may be a ground potential or power signal potential.

The circuit board may further include a second electrically conductive trace on the first surface of the dielectric material layer. The first electrically conductive feature may be between the first and second electrically conductive traces.

In another embodiment, a method for forming a circuit board includes forming a first electrically conductive feature, a second electrically conductive feature, and an electrically conductive trace on a first surface of a dielectric material layer, the electrically conductive trace being positioned between the first and second electrically conductive features, forming a layer of an electrically insulating material on the first surface of the dielectric material layer that covers at least a portion of the electrically conductive trace, and forming a layer of an electrically conductive material on the electrically insulating material and in electrical contact with the first and second electrically conductive features.

The forming a layer of an electrically conductive material on the electrically insulating material and in electrical contact with the first and second electrically conductive features may comprise forming the electrically conductive material in a grid shape on the electrically insulating material.

The forming a first electrically conductive feature, a second electrically conductive feature, and an electrically conductive trace on a first surface of a dielectric material layer, the electrically conductive trace being positioned between the first and second electrically conductive features may comprise forming the first electrically conductive feature as a second electrically conductive trace, and forming the second electrically conductive feature as a third electrically conductive trace.

The forming a first electrically conductive feature, a second electrically conductive feature, and an electrically conductive trace on a first surface of a dielectric material layer, the electrically conductive trace being positioned between the first and second electrically conductive features may comprise forming the first electrically conductive feature as a first electrically conductive pad, and forming the second electrically conductive feature as a second electrically conductive pad.

The method may further include forming a second electrically conductive trace adjacent to the first electrically conductive trace on the first surface of the dielectric material layer between the first and second electrically conductive features. The first and second electrically conductive traces may form a transmission line pair.

The forming a layer of an electrically conductive material on the electrically insulating material and in electrical contact with the first and second electrically conductive features may comprise forming the layer of electrically insulating material to cover at least a portion of the second electrically conductive trace.

The electrically conductive material may be an electrically conductive epoxy. The forming a layer of an electrically conductive material on the electrically insulating material and in electrical contact with the first and second electrically conductive features may comprise applying a layer of the electrically conductive epoxy on the first surface of the dielectric material layer, and curing the electrically conductive epoxy.

The electrically conductive material may be an electrically conductive foil. The forming a layer of an electrically conductive material on the electrically insulating material and in electrical contact with the first and second electrically conductive features may comprise attaching the electrically conductive foil to the first surface of the dielectric material layer.

The method may further include electrically coupling the first and second electrically conductive features to a signal net associated with an electrical potential. The electrical potential may be a ground potential or power signal potential.

The method may further include forming a second electrically conductive trace on the first surface of the dielectric material layer such that the first electrically conductive feature is between the first and second electrically conductive traces.

The forming a layer of an electrically insulating material on the first surface of the dielectric material layer that covers at least a portion of the electrically conductive trace may comprise forming a solder mask layer on the first surface of the dielectric material layer, and forming openings through the solder mask layer at the first and second electrically conductive features.

The forming a layer of an electrically conductive material on the electrically insulating material and in electrical contact with the first and second electrically conductive features may comprise forming the layer of electrically conductive material to make electrical contact with the first and second electrically conductive features through the openings.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:
1. A circuit board, comprising:
a dielectric material layer having opposing first and second surfaces;
a first electrically conductive feature on the first surface of the dielectric material layer, the first electrically conductive feature being planar;
a second electrically conductive feature on the first surface of the dielectric material layer, the second electrically conductive feature being coplanar with the first electrically conductive feature;
a first electrically conductive trace on the first surface of the dielectric material layer between the first and second electrically conductive features;
a second electrically conductive trace on the first surface of the dielectric material layer between the first and second electrically conductive features;
an electrically insulating material on the first surface of the dielectric material layer that covers at least a portion of the first electrically conductive trace and the second electrically conductive trace, the electrically insulating material having a maximum thickness that is less than a thickness of the dielectric material layer;
a plurality of openings formed in the electrically insulating material to provide access to the first and second electrically conductive features, each of the openings having a width that is greater than a width of at least one of the first or second electrically conductive features, the first electrically conductive feature being a third electrically conductive trace and the second electrically conductive feature being a fourth electrically conductive trace; and
an electrically conductive material formed on the electrically insulating material and in electrical contact with the first and second electrically conductive features through the openings.

2. The circuit board of claim 1, wherein the electrically conductive material is formed in a grid shape on the electrically insulating material.

3. The circuit board of claim 1, wherein the first and second electrically conductive traces form a transmission line pair.

4. The circuit board of claim 1, wherein the electrically conductive material is an electrically conductive epoxy or an electrically conductive foil.

5. The circuit board of claim 1, wherein the first and second electrically conductive features are electrically coupled to an electrical potential.

6. The circuit board of claim 5, wherein the electrical potential is a ground potential or power signal potential.

7. A circuit board, comprising:
a dielectric material layer having opposing first and second surfaces;
a first electrically conductive feature on the first surface of the dielectric material layer, the first electrically conductive feature being planar;
a second electrically conductive feature on the first surface of the dielectric material layer, the second electrically conductive feature being coplanar with the first electrically conductive feature;
a first electrically conductive trace on the first surface of the dielectric material layer between the first and the second electrically conductive features;
a second electrically conductive trace on the first surface of the dielectric material layer,
an electrically insulating material on the first surface of the dielectric material layer comprising a first electrically insulating portion that covers at least a portion of the first electrically conductive trace, and a second electrically insulating portion that covers at least a portion of the second electrically conductive trace, the first electrically insulating portion having a maximum thickness that is less than a thickness of the dielectric material layer; and
an electrically conductive material formed on the electrically insulating material and in electrical contact with the first and second electrically conductive features, the second electrically conductive trace comprising a first portion that curves under and is covered by the electrically conductive material and a second portion that is not covered by the electrically conductive material.

8. The circuit board of claim 7, wherein the electrically conductive material is formed in a grid shape on the electrically insulating material.

9. The circuit board of claim 7, wherein the first electrically conductive feature is a third electrically conductive trace, and the second electrically conductive feature is a fourth electrically conductive trace.

10. The circuit board of claim 7, wherein the first electrically conductive feature is a first electrically conductive pad, and the second electrically conductive feature is a second electrically conductive pad.

11. The circuit board of claim 7, further comprising:
a third electrically conductive trace adjacent to the first electrically conductive trace on the first surface of the dielectric material layer between the first and second electrically conductive features, wherein the first and third electrically conductive traces form a transmission line pair;
wherein the first electrically insulating portion covers at least a portion of the third electrically conductive trace.

12. The circuit board of claim 7, wherein the electrically conductive material is an electrically conductive epoxy or electrically conductive foil.

13. The circuit board of claim 7, wherein the first and second electrically conductive features are electrically coupled to an electrical potential.

14. The circuit board of claim 13, wherein the electrical potential is a ground potential or a power signal potential.

15. A method for forming a circuit board, comprising:
forming a first electrically conductive feature, a second electrically conductive feature, a first electrically conductive trace, and a second electrically conductive trace on a first surface of a dielectric material layer, wherein the first electrically conductive trace is between the first and the second electrically conductive features, the first electrically conductive feature being planar and the second electrically conductive feature being coplanar with the first electrically conductive feature;
forming a layer of an electrically insulating material on the first surface of the dielectric material layer, the layer of the electrically insulating material having a maximum thickness that is less than a thickness of the dielectric material layer;
forming a plurality of openings in the layer of the electrically insulating material to provide access to the first and second electrically conductive features, each of the openings having a width that is greater than a width of at least one of the first or second electrically conductive features, the first electrically conductive feature being a third electrically conductive trace and the second electrically conductive feature being a fourth electrically conductive trace; and
forming a layer of an electrically conductive material on the electrically insulating material and in electrical contact with the first and the second electrically conductive features through the openings.

16. The method of claim 15, wherein said forming a layer of an electrically conductive material on the electrically insulating material and in electrical contact with the first and the second electrically conductive features comprises:
forming the electrically conductive material in a grid shape on the electrically insulating material.

17. The method of claim 15, wherein said forming a first electrically conductive feature, a second electrically conductive feature, a first electrically conductive trace, and a second electrically conductive trace on a first surface of a dielectric material layer comprises:
forming the second electrically conductive trace to have a first portion that curves under and is covered by the layer of the electrically conductive material and a second portion that is not covered by the layer of the electrically conductive material.

18. The method of claim 15, wherein said forming a plurality of openings in the layer of the electrically insulating material comprises:
forming elongated openings that are positioned along the lengths of the first and second electrically conductive features.

19. The method of claim 15, further comprising:
electrically coupling the first and second electrically conductive features to a signal net associated with an electrical potential.

20. A method for forming a circuit board, comprising:
forming a first electrically conductive feature, a second electrically conductive feature, a first electrically conductive trace, and a second electrically conductive trace on a first surface of a dielectric material layer, wherein the first electrically conductive trace is between the first and the second electrically conductive features;

forming a layer of an electrically insulating material on the first surface of the dielectric material layer comprising a first electrically insulating portion that covers at least a portion of the first electrically conductive trace, and a second electrically insulating portion that covers at least a portion of the second electrically conductive trace; and forming a layer of an electrically conductive material on the electrically insulating material and in electrical contact with the first and the second electrically conductive features, wherein the electrically conductive material is an electrically conductive epoxy, wherein said forming a layer of an electrically conductive material on the electrically insulating material and in electrical contact with the first electrically conductive features comprises:

applying a layer of the electrically conductive epoxy on the first surface of the dielectric material layer; and curing the electrically conductive epoxy.

\* \* \* \* \*